(12) United States Patent
Satoh et al.

(10) Patent No.: US 8,813,984 B2
(45) Date of Patent: Aug. 26, 2014

(54) WATERPROOF BOX

(75) Inventors: Kouki Satoh, Kakegawa (JP); Noriaki Akamine, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 13/377,028

(22) PCT Filed: Jun. 9, 2010

(86) PCT No.: PCT/JP2010/059751
§ 371 (c)(1),
(2), (4) Date: Dec. 8, 2011

(87) PCT Pub. No.: WO2010/147036
PCT Pub. Date: Dec. 23, 2010

(65) Prior Publication Data
US 2012/0091154 A1  Apr. 19, 2012

(30) Foreign Application Priority Data

Jun. 19, 2009 (JP) .................. 2009-145947

(51) Int. Cl.
*B65D 6/10* (2006.01)
*B65D 43/08* (2006.01)
*B65D 41/18* (2006.01)
*B65D 43/20* (2006.01)
*B65D 39/00* (2006.01)

(52) U.S. Cl.
USPC ......... 220/4.21; 220/835; 220/4.26; 220/664; 220/780; 220/782; 220/784; 220/786; 220/788

(58) Field of Classification Search
USPC ............... 220/4.26, 4.21, 780, 782, 661, 664, 220/677, 835, 784, 786, 788; 174/17.06, 174/564
See application file for complete search history.

(56) References Cited

U.S. PATENT DOCUMENTS

| 5,574,254 | A  | * | 11/1996 | Mori et al. ..................... 174/561 |
| 6,629,619 | B2 | * | 10/2003 | Sato et al. ..................... 220/4.02 |
| 2007/0164020 | A1 | * | 7/2007 | Arnett et al. ................. 220/4.21 |
| 2010/0127012 | A1 | * | 5/2010 | Takeuchi et al. ............. 220/810 |

FOREIGN PATENT DOCUMENTS

| JP | 1-76123 U | 5/1989 |
| JP | 09-216648 A | 8/1997 |
| JP | 2000-004521 A | 1/2000 |
| JP | 2000004521 | * 1/2000 |
| JP | 2001-072116 A | 3/2001 |

OTHER PUBLICATIONS

International Search Report dated Sep. 7, 2010, issued for PCT/JP2010/059751.
Chinese Office Action dated Dec. 18, 2013, issued for corresponding Chinese Patent Application No. 201080027049.6.

* cited by examiner

*Primary Examiner* — Fenn Mathew
*Assistant Examiner* — Don M Anderson
(74) *Attorney, Agent, or Firm* — Edwards Wildman Palmer LLP

(57) ABSTRACT

The present invention is to provide a waterproof box capable of improving waterproof performance and workability, and space-saving. When high-pressure washing is performed, washing water injected toward the waterproof box hits a peripheral wall of a box main body, and then washing water is increased along the peripheral wall. Since the increased washing water hits a lower surface of a first waterproof portion of a main body side waterproof structure, some force of the water is reduced. Furthermore, a part of the increase washing water passes through a space arranged inside of a wall upward.

7 Claims, 7 Drawing Sheets

WATERPROOF BOX

CROSS REFERENCE TO RELATED APPLICATIONS

This application is related to three co-pending applications, all entitled, "WATERPROOF BOX" filed concurrently herewith, in the names of Kunihiko TAKEUCHI and Hiroaki YAMADA as a national stage application of International Application No. PCT/JP2010/059703, filed Jun. 8, 2010; in the names of Kunihiko TAKEUCHI and Hiroaki YAMADA as a national stage application of International Application No. PCT/JP2010/059702, filed Jun. 8, 2010; and in the names of Sunsoku I and Yasuhito SUZUKI as a national stage application of International Application No. PCT/JP2010/059750, filed Jun. 9, 2010; which co-pending applications are assigned to the assignee of the instant application and also incorporated by reference herein.

TECHNICAL FIELD

The present invention relates to a waterproof box waterproofed by overlapping a box main body side waterproof structure with a cover side waterproof structure.

BACKGROUND OF THE INVENTION

For example, an electric junction box installed in an engine room of a vehicle has connection parts of a wiring harness, electric parts such as a relay or fuse, and electric component such as an electronic control unit. It is required to keep liquid such as water away from all parts of the electric junction box when the vehicle runs in the rain or the engine room is washed with high-pressure. For this reason, the electric junction box is constructed with a waterproofed box main body receiving the electric parts and the like, and a waterproofed cover for covering an upper opening of the box main body. The electric junction box has a function as a waterproof box.

For the waterproof box, various waterproof types are known. For example, one type is waterproofed by sandwiching a packing between a waterproof structure arranged in the box main body and a waterproof structure arranged in the cover (see Patent Document 1). Further, another type is waterproofed by overlapping the waterproof structure of the box main body with the waterproof structure of the cover without using the packing (see Patent Document 2).

In the waterproof box of type using the packing, since the packing sandwiched between the waterproof structures covers a gap, waterproof performance can be increased. However, there is a problem such that the parts of the packing are increased, and as a result costs are increased. Furthermore, process for installing the packing is increased. For this reason, in recent years, the waterproof box of type not using the packing is used.

The waterproof box of type not using the packing disclosed in the Patent Document 2 includes a box main body having an upper opening and a cover for covering the upper opening of the box main body. The waterproof box is waterproofed by overlapping waterproof structures which are provided in a box body and a cover joint respectively. More specifically, the box main body side waterproof structure has a circular waterproof projection arranged around the tip of the peripheral wall of the box main body. The cover side waterproof structure has a circular waterproof dent arranged around the tip of the cover peripheral wall of the cover.

In the above configuration and construction, the cover is arranged in the upper side of the upper opening of the box main body. And then, the cover is moved straight down, and the waterproof structures are overlapped. At this time, the waterproof projection is inserted in the waterproof dent. Further, a main body lock arranged in the waterproof structure of the box main body is locked on a U-shaped cover lock arranged in the cover waterproof structure. Thereby the box main body and the cover are locked, and become the locked state. The main body lock and the cover lock are provided in at least two positions which is located at the right and left sides of the waterproof box (or at the back and forth sides thereof). The two positions are separately located each other.

PRIOR ART DOCUMENT

Patent Document

Patent document 1: Japanese Patent Publication Application No. 2001-72116
Patent document 2: Japanese Patent Publication Application No. H09-216648

DISCLOSURE OF THE INVENTION

Problem to be Solved by the Invention

However, in the waterproof box of type not using the packing, there is a problem such as the following. More specifically, when injection water pressure with high-pressure washing is high, the washing water injected toward the waterproof box hits in the peripheral wall of the box main body. Thereafter, the washing water is increased along the peripheral wall, and passes through a minute gap between the overlapped waterproof structures. As a result, liquid such as water enters into the inside of the waterproof box.

In the Patent document 2, the inner walls are respectively arranged inside waterproof structures of the peripheral wall and the cover peripheral wall. Therefore, although water enters into the inside in the above condition, electric components are prevented from getting wet by the inner wall. However, it is difficult to arrange the inner wall in various waterproof boxes because the inner wall can not be partly arranged therein. Therefore, it is required to provide effective measures against waterproof structures of the box main body and the cover.

Recently, an aluminum electric wire is arranged in the waterproof box. The connection of the aluminum electric wire does not like water adhesion. For this reason, the need for preventing water adhesion is increasing.

Also, in the waterproof box of type not using the packing, there is a problem such as the following. More specifically, when the locked state of the main body lock and the cover lock is canceled, at least two positions respectively have to be canceled. Its work is troublesome work for a worker or user. Furthermore, when the locked states in two positions are canceled respectively and then the cover is removed, it is necessary to maximize the space which is able to use both hands in the upper side of the waterproof box. Also, it goes without saying that waterproof performance has to be maintained so as to solve those problems.

Accordingly, an object of the present invention is to provide a waterproof box which can improve waterproof performance and work, and can save space.

SUMMARY OF THE INVENTION

Means for Solving the Problem

In order to attain the above-described objectives, according to a first aspect of the present invention, a waterproof box of the present invention includes a box main body having a peripheral wall and receiving components inside of the peripheral wall, the components disliking water, a cover having a cover peripheral wall and covering an opening of edges of the peripheral wall of the box main body, a main body side waterproof structure arranged in the edges of the peripheral wall of the box main body, and a cover side waterproof structure arranged in edges of cover peripheral wall of the cover. The main body side waterproof structure is overlapped with the cover side waterproof structure so as to waterproof. Furthermore, a wall, which is located outside an overlapped portion and opposed to an outer surface of the peripheral wall at a predetermined space, is provided as one of a part of the main body side waterproof structure and a part of the cover side waterproof structure.

According to the present invention having the above feature, the ingress of water in an overlapped portion can be prevented by providing the wall.

According to a second aspect of the present invention in the context of the first aspect thereof, the waterproof box further includes a main body side matching surface of the main body side waterproof structure, a cover side matching surface of the cover side waterproof structure, and a micro passage generated in a space between the main body side matching surface and the cover side matching surface. The main body side matching surface and the cover side matching surface are opposed each other by overlapping. Further, an inlet of the micro passage is arranged so that the wall is positioned in front of the inlet at intervals.

According to the present invention having the above feature, the micro passage generated in a space between the opposed main body side matching surface and the opposed cover side matching surface, namely, the micro passage is a passage of the water. Thus, the ingress of the water from a front of the inlet of the micro passage can be prevented by providing the wall.

According to a third aspect of the present invention in the context of the first aspect thereof, the inlet of the micro passage is arranged outward in a direction perpendicular to the outer surface of the peripheral wall of the box main body.

According to the present invention having the above feature, the ingress of water increasing along the peripheral wall or decreasing along the cover peripheral wall can be prevented.

According to a fourth aspect of the present invention in the context of the first aspect thereof, rotation supporting points are arranged in the main body side waterproof structure and the cover side waterproof structure respectively so as to rotatably and removably move the cover against the box main body.

According to the present invention having the above feature, the cover is rotatably moved about the rotation supporting point. The cover can cover and remove the opening of the box main body by rotating it. In the box main body and the cover, lock structure for locking them is provided in a position opposite to the position arranging the rotation supporting point. That is, lock cancel is performed with one position. According to the present invention, removing of the cover can be performed with one action by on hand.

Effects of the Invention

According to the first aspect of the present invention described above, the wall as a part of the main body waterproof structure or the cover side waterproof structure is provided. Thereby, the ingress of water can be prevented. Thus, according to the present invention, waterproof performance can be improved than ever before.

According to the second aspect of the present invention described above, since the wall is arranged in front of the inlet of micro passage, the ingress of water can be prevented. Thus, according to the present invention, waterproof performance can be improved than ever before.

According to the third aspect of the present invention described above, since the inlet of the micro passage is arranged in the direction perpendicular to the outer surface of the wall of the box main body, the ingress of water can be prevented. Thus, according to the present invention, waterproof performance can be improved than ever before.

According to the fourth aspect of the present invention described above, the cover can be removed with one action by one hand by arranging the rotation supporting points. Thus, according to the present invention, workability can be improved. Furthermore, it is not required to secure large space above the cover so as to remove the cover with both hands. As a result, space can be saved.

DESCRIPTION OF THE PREFERRED EMBODIMENT

Figure 1:
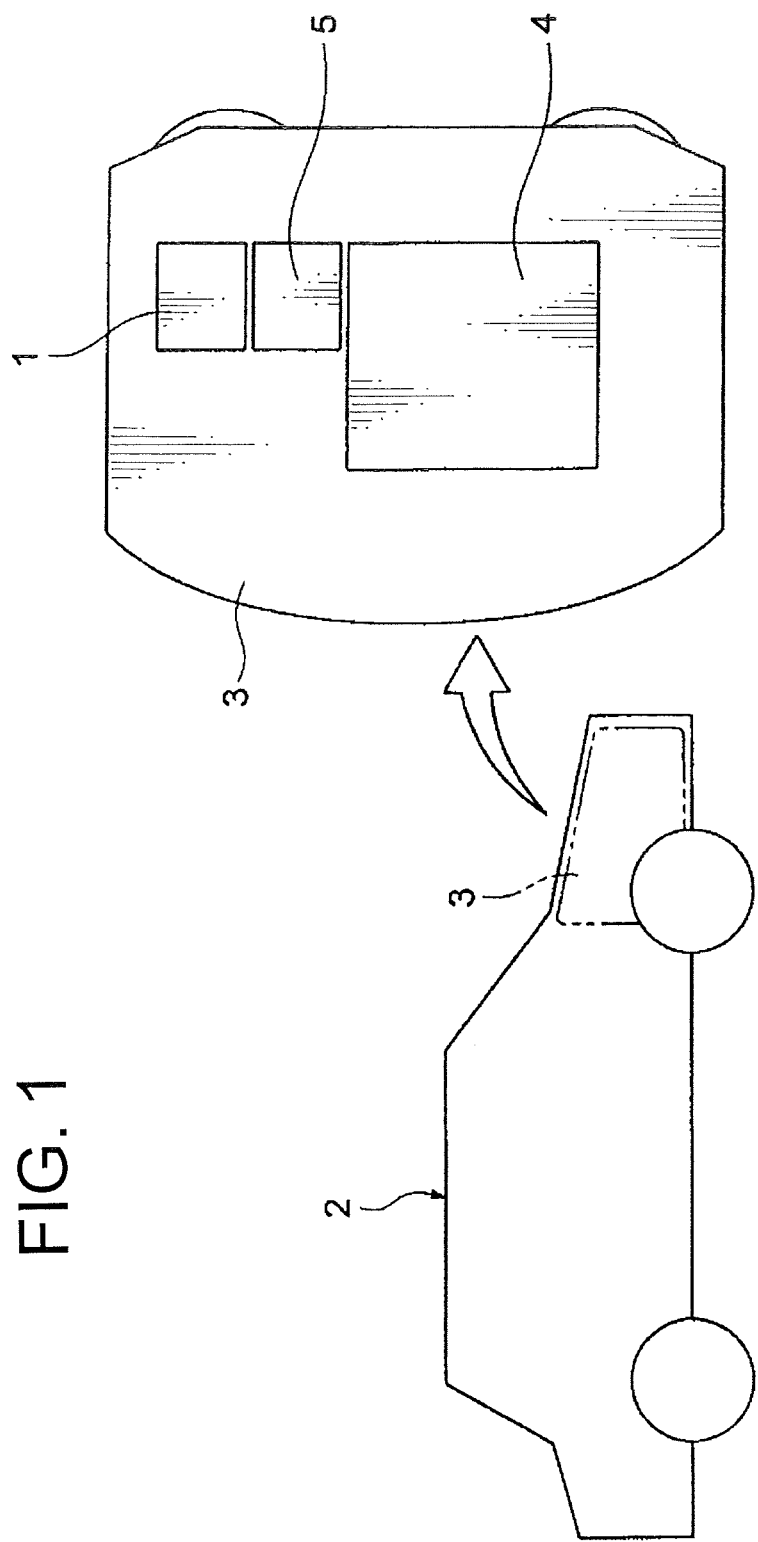
FIG. 1 is a frame format view showing an example of installation of an electric junction box including a waterproof box of the present invention.
Figure 2:
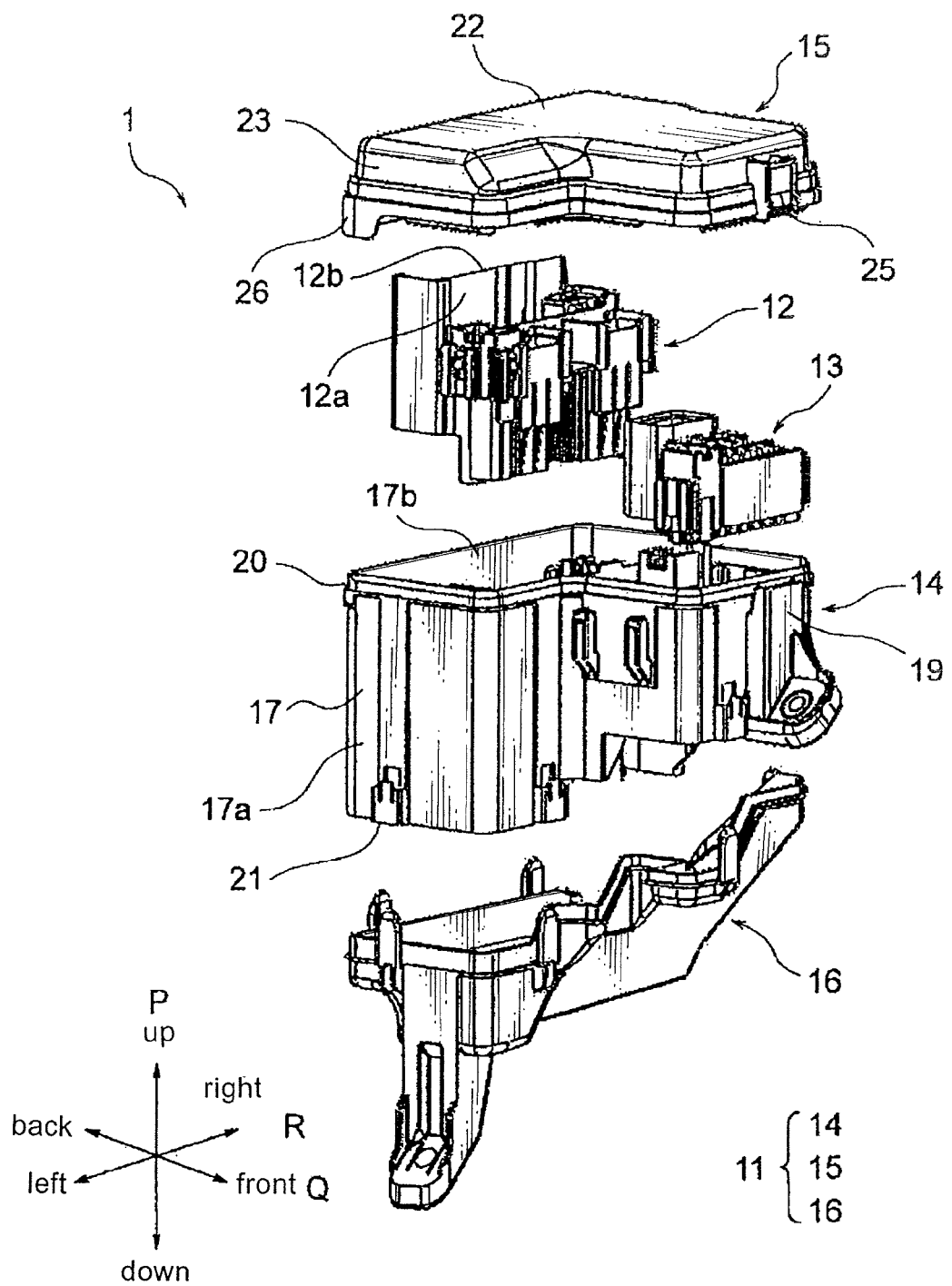
FIG. 2 is an exploded perspective view of the electric junction box.

Hereafter, one example according to an embodiment of the present invention will be explained with reference to the drawings. FIG. 1 is an exemplary diagram showing an example of installation of an electric junction box including a waterproof box of the present invention. FIG. 2 is an exploded perspective view of the electric junction box. FIGS. 3 to 11 are various views according to the waterproof box of the present invention.

The reference numeral 1 in FIG. 1 shows an electric junction box (self-contained device of vehicular electric components such as R/B: relay box, J/B: junction box, ECU, and the like). The electric junction box 1 is a relay box, but not limited thereto, and mounted on an engine room 3 of a vehicle 2. In the engine room 3, a battery 5 is installed next to an engine 4. The electric junction box 1 is installed next to the battery 5. Since the electric junction box 1 is installed in the engine room 3, it is required to keep fluid like water away from electric components (components do not like water) of the inside of the electric junction box 1 when the vehicle runs in the rain or the engine room 3 is washed with high-pressure.

The electric junction box 1 described below has a waterproof box of the present invention. Even if the injection water pressure in high-pressure is high water pressure such as 8 MPa-12 MPa, the ingress of the water into internal electric parts are prevented.

As shown in FIG. 2, the electric junction box 1 has a waterproof box 11 made of synthetic resin, and functional parts 12 and 13 which are received in the waterproof box 11. In the waterproof box 11, for example, a wiring harness (not shown) including an aluminum electric wire is guided. The functional parts 12 and 13 include parts such as a relay (parts such as a relay are not shown in drawings. FIG. 2 mainly shows diagram of cavity). In the cavity of the functional part 12, an inner wall 12a described below is arranged.

The waterproof box 11 has a box main body 14 receiving the functional parts 12 and 13, an upper cover 15 (corresponding to a cover in claims) covering an upper opening of the box main body 14, and a lower cover 16 fitting in the lower section of the box main body 14.

The box main body 14 and the upper cover 15 in the present invention have several features, respectively. As one of the features, although the packing is not used, the waterproof box has waterproof structure which can maintain high waterproof performance. As the other of the features, the upper cover 15 is rotatably moved against the box main body 14, and can be attached and removed with one hand action (one action). Hereafter, the box main body 14 and the upper cover 15 will be explained while those features are included.

The box main body 14 has a peripheral wall 17. The peripheral wall 17 is formed into a frame shape. As shown in FIG. 2, for example the peripheral wall 17 is formed into a shape continuing a plurality of walls. Incidentally, an arrow P defines up and down direction, an arrow Q defines front and back direction, and an arrow R defines right and left direction (Here, the front and back direction and the right and left direction are defined without matching front and back direction of the engine room 3 and right and left direction thereof). In outer surface of the back side wall in the peripheral wall 17, a rotation supporting point 18 is arranged so as to rotate and remove the upper cover 15 (see FIG. 3). Further, a main body lock 19 is arranged so as to lock the upper cover 15 in outer surface of the front side wall of the peripheral wall 17.

The upper cover 15 is rotatably moved around the rotation supporting point 18, and is locked on the main body lock 19 of the box main body 14. When the locked state is canceled, at the same time, and the upper cover 15 is rotated so that the upper cover 15 is lifted, the upper cover 15 can be easily removed from the box main body 14.

A main body side waterproof structure 20 is arranged around the top end of the peripheral wall 17 so as to waterproof. Further, a joint 21 is arranged in the lower portion of the peripheral wall 17 so as to fit the lower cover 16. Incidentally, the joint 21 is formed with well-known construction. So explanation of the joint 21 is omitted in the embodiment.

The upper cover 15 is a cover member made to conform to the shape of the box main body 14, and has a ceiling wall 22 and a cover peripheral wall 23. The ceiling wall 22 is positioned in the top of the waterproof box 11. The cover peripheral wall 23 extends from the peripheral wall of the ceiling wall 22 downward. In the back side wall of the cover peripheral wall 23, a rotation supporting point 24 (see FIG. 3) is arranged with the rotation supporting point 18 (see FIG. 3) of the box main body 14. The rotation supporting point 24 is the center of rotation of the upper cover 15. Also, in the front side wall of the cover peripheral wall 23, a lock cover 25 is arranged so as to be caught and locked in the main body lock 19. In the bottom end of the cover peripheral wall 23, a cover side waterproof structure 26 is arranged so as to waterproof.

A common known lower cover is used as the lower cover 16, and a detailed explanation of the lower cover 16 is omitted.

Figure 3:
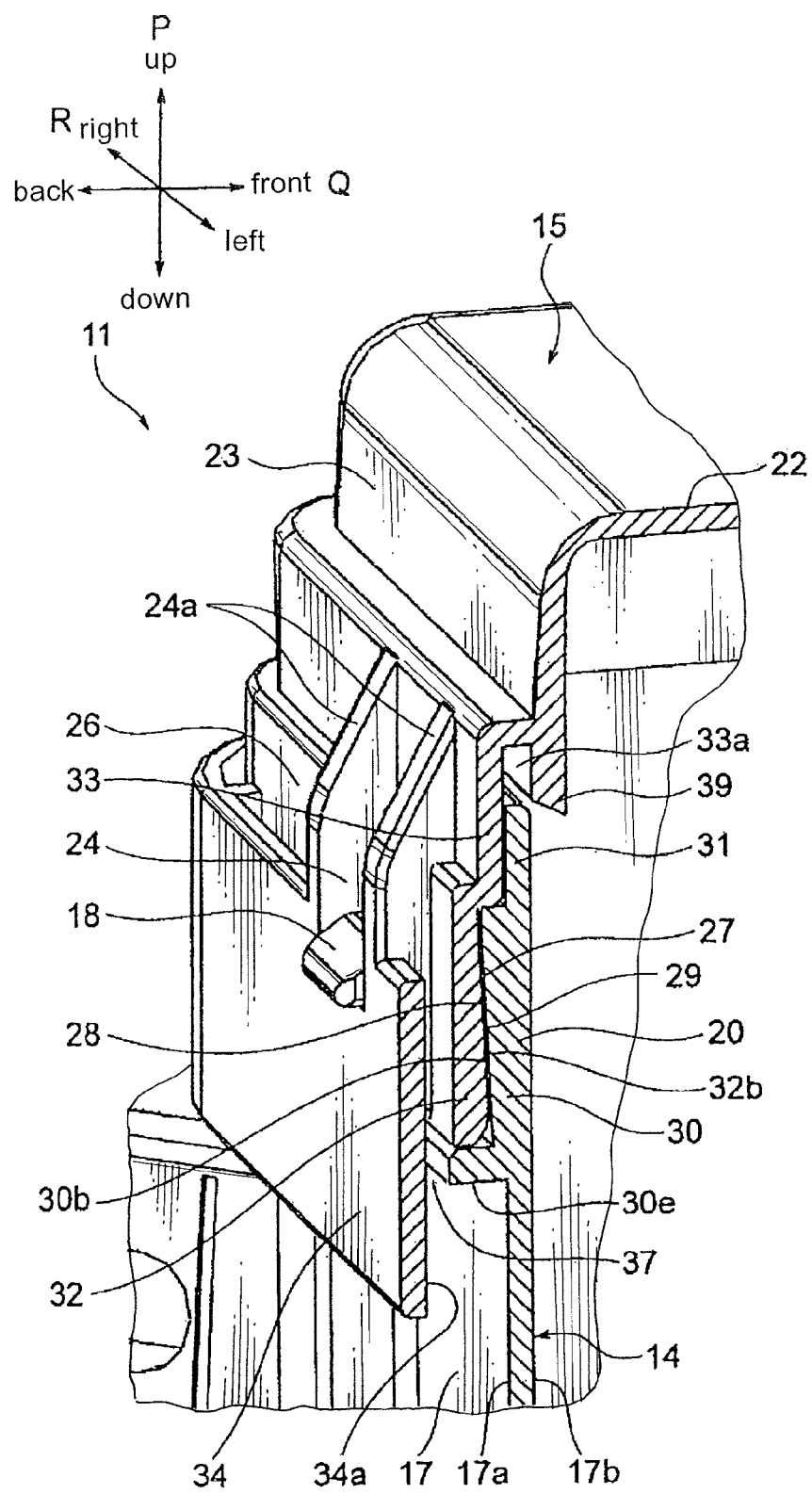
FIG. 3 is a perspective view showing a main body side waterproof structure, a cover side waterproof structure and a wall (includes a part cross-section)
Figure 4:
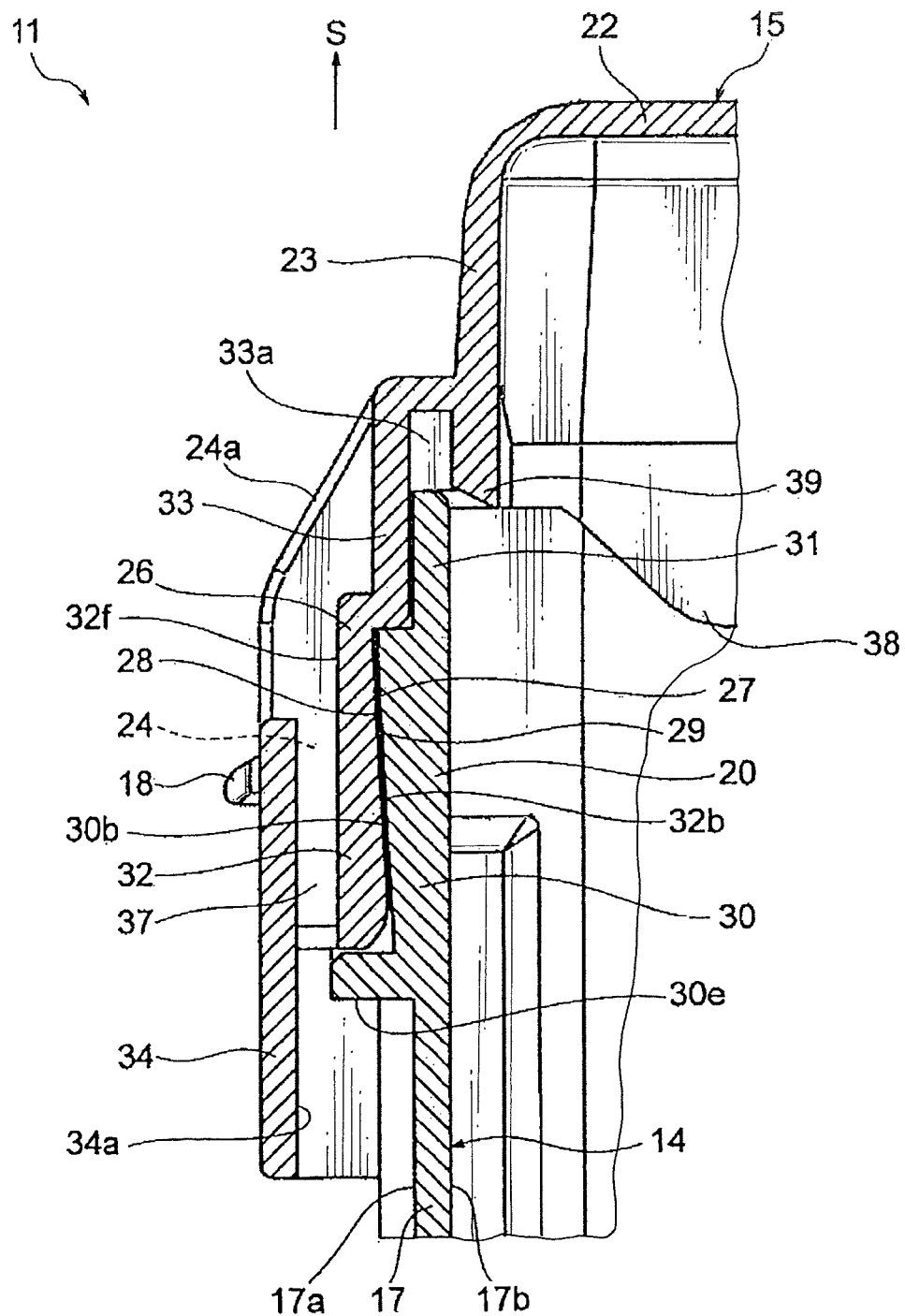
FIG. 4 is a cross-sectional view showing the main body side waterproof structure, the cover side waterproof structure and the wall.
Figures 5A, 5B:
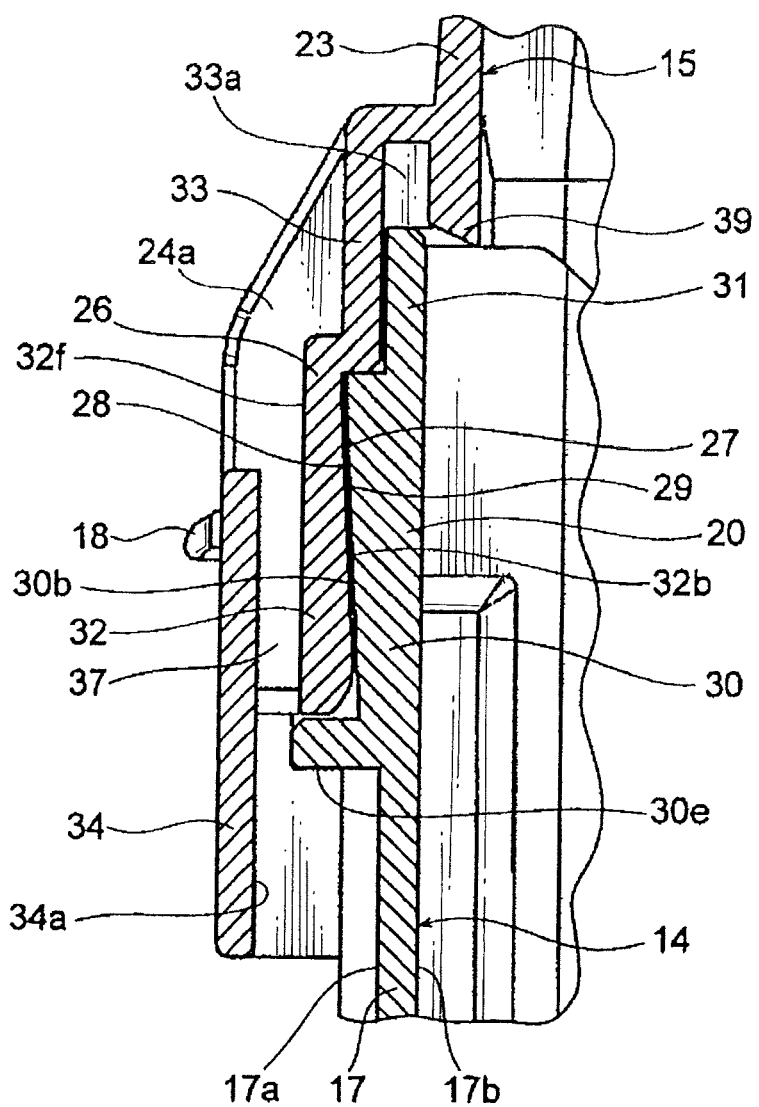
FIG. 5A is a cross-sectional view of the main body side waterproof structure, the cover side waterproof structure and the wall according to a micro passage.
FIG. 5B is a frame format view of a micro passage.
Figure 6:
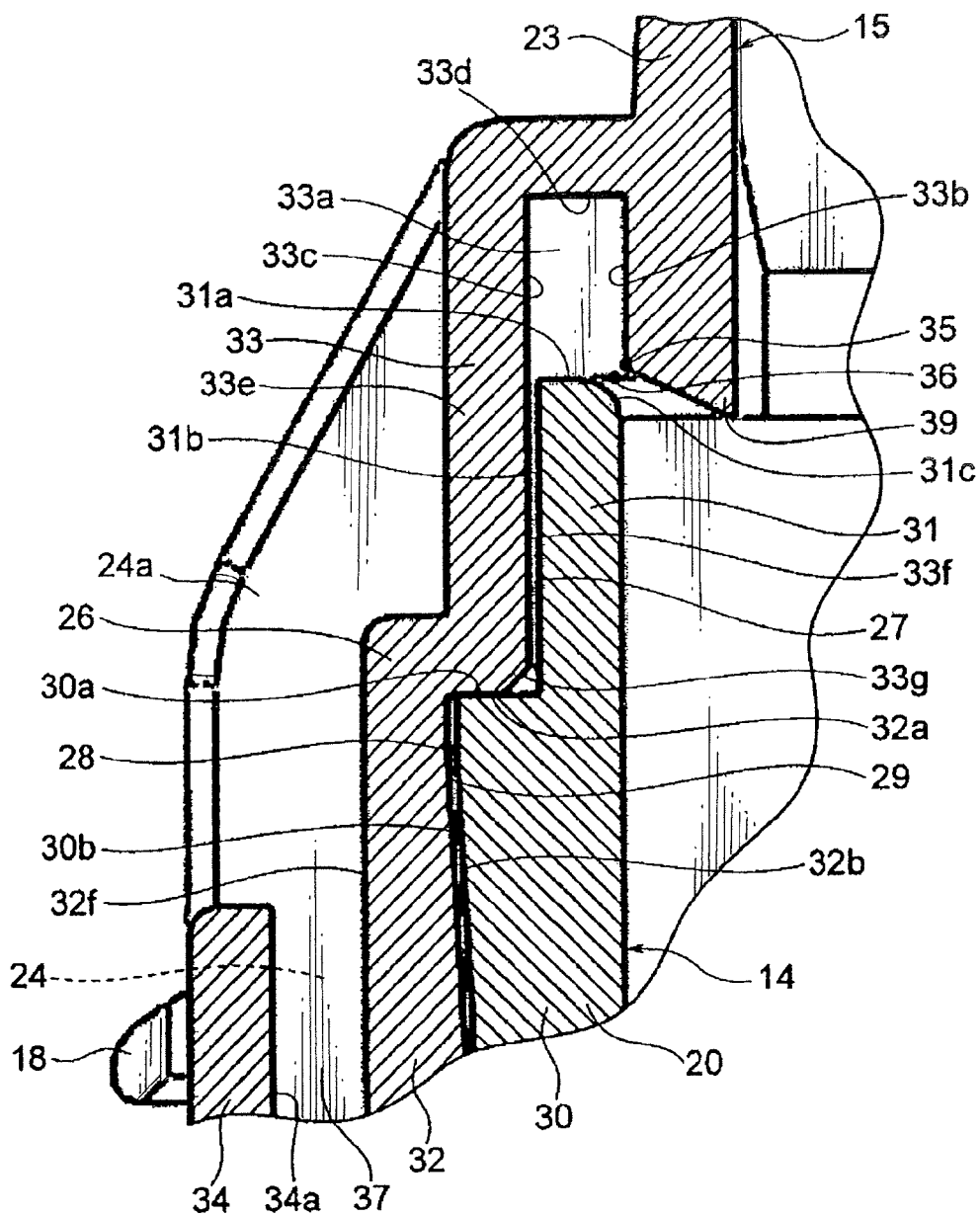
FIG. 6 is an enlarged sectional view second waterproof portion and first waterproof portion.
Figure 7:
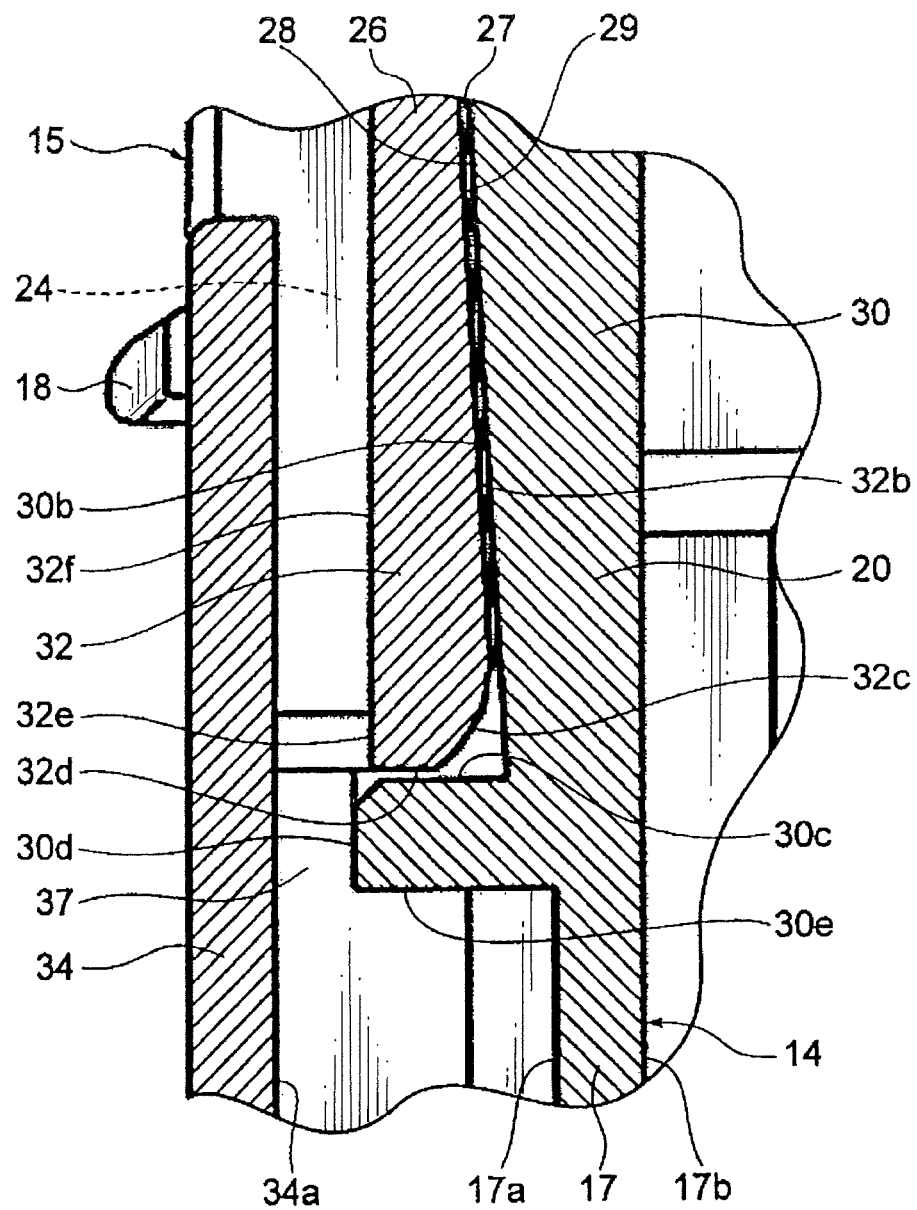
FIG. 7 is an enlarged sectional view the first waterproof portion and the wall.

The main body side waterproof structure 20 and the cover side waterproof structure 26 will be explained with reference to FIGS. 3 to 7. In FIGS. 3 and 4, as typical examples of all circumferences of the peripheral wall, waterproof structure of the wall including the rotation supporting points 18 and 24 is respectively shown.

In FIGS. 3 and 4, the upper cover 15 is rotated against the box main body 14, and is locked in the box main body 14. When the upper cover 15 is locked in the box main body 14, the main body side waterproof structure 20 and the cover side waterproof structure 26 are overlapped as shown in FIGS. 3 and 4.

While, in order to rotate the upper cover 15, it is required to consider rotation trajectory in structure. However, it is impossible to be overlapped around all circumferences without a gap. Therefore, a micro passage 27 generated by a gap between opposed surfaces (matching surfaces described below) is formed between the main body side waterproof structure 20 and the cover side waterproof structure 26 (FIG. 5B indicates a water infiltration direction and shows exemplary micro passage 27). Also, preventing the ingress of water in the micro passage 27 and greatly reducing the entering water power are purpose of waterproof structure of the waterproof box 11.

A main body side matching surface 28 is formed in the main body side waterproof structure 20. A cover side matching surface 29 is formed in the cover side waterproof structure 26. The main body side matching surface 28 and the cover side matching surface 29 are opposed by overlapping the upper cover 15 and the box main body 14. Each surface constructing the main body matching surface 28 and the cover side matching surface 29 will be explained below.

In FIGS. 3 to 7, the main body side waterproof structure 20, as discussed previously, is arranged in the top end of the peripheral wall 17, and is a part for preventing water entry. Further, the main body side waterproof structure 20 has a first waterproof portion 30 arranged in the inlet of the micro passage 27, and a second waterproof portion 31 arranged in the outlet of the micro passage 27 (inlet of the micro passage 27 is a portion in which water is first entered from outside). The waterproof box of the present invention will be explained from the second waterproof portion 31 sequentially.

The second waterproof portion 31 is located at the top edge of the peripheral wall 17, and formed in the same thickness as the peripheral wall 17 (an outer surface 17a and an inner surface 17b, which they determine the thickness of the peripheral wall 17, are formed along the up and down direction). The second waterproof portion 31 has an upper surface 31a fitting in the top end of the peripheral wall 17. The upper surface 31a is formed as a surface including a part of the main body side matching surface 28. Also, the outer surface 31b perpendicular to the upper surface 31a and continuing thereto is formed as a surface including a part of the main body side matching surface 28. The outer surface 31b is formed parallel to an inner surface 17b of the peripheral wall 17. The upper surface 31a has a chamfered portion 31c arranged in a position continuing to the inner surface 17b.

The first waterproof portion 30 is arranged under the second waterproof portion 31 and formed. The first waterproof portion 30 is formed with a width thicker than the second waterproof portion 31. The first waterproof portion 30 is formed so that the portion thicker than the second waterproof portion 31 is projected outward. The upper surface 30a of the first waterproof portion 30 is perpendicular to the outer surface 31b of the second waterproof portion 31 and continued thereto. Further, the upper surface 30a is formed parallel to the upper surface 31a of the second waterproof portion 31. The upper surface 30a is formed with almost the same length as the upper surface 31b of the second waterproof portion 31. The upper surface 30a is formed as a surface including a part of the main body side matching surface 28. The outer surface 30b continued to the upper surface 30a is not parallel to the inner surface 17b of the peripheral wall 17. The outer surface 30b is sloped and formed. More specifically, the outer surface 30b is formed into a taper shape in which distance from the inner surface 17b becomes gradually small toward bottom.

An inlet position upper surface 30c is arranged in the inlet position of the micro passage 27 and is continued to the outer surface 30b. The inlet position upper surface 30c is formed parallel to the upper surface 30a. The inlet position upper surface 30c is formed longer than the upper surface 30a because the lower side of the outer surface 30b is arranged close to the inner surface 17b. The reference numeral 30d shows an inlet position outer surface parallel to the outer surface 17a of the peripheral wall 17. Also, the reference numeral 30e shows a lower surface perpendicular to the inlet position outer surface 30d and parallel to the inlet position upper surface 30c. The inlet position upper surface 30c and the outer surface 30b formed in a tapered shape are formed as a surface including a part of the main body side matching surface 28. In a prescribed position of the outer surface 30b, the rotation supporting point 18 which is formed into a protrusion shape and projects outward is arranged.

The main body side matching surface 28 including surfaces from the upper surface 31a of the second waterproof portion 31 to the inlet position upper surface 30c of the first waterproof portion 30 is formed in a stepped shape, namely, labyrinthine shape. That is, the main body side matching surface 28 is formed in a shape in which water is hard to enter.

On the other hand, the cover side waterproof structure 26, as discussed previously, is arranged in the bottom end of the cover peripheral wall 23, and is a part for preventing the ingress of water.

Further, the cover side waterproof structure 26 has the first waterproof portion 32 arranged in the inlet of the micro passage 27, the second waterproof portion 33 arranged in the outlet of the micro passage 27. The wall of the cover side waterproof structure 26 is formed in a skirt shape opening outward. Further, the cover side waterproof structure 26 has a wall 34 arranged at predetermined intervals against the inlet of the micro passage 27.

The first waterproof portion 32 is arranged and formed corresponding to the first waterproof portion 30 of the main body side waterproof structure 20. Further, the second waterproof portion 33 is arranged and formed corresponding to the second waterproof portion 31 of the main body side waterproof structure 20. It will be explained from the second waterproof portion 33 sequentially.

The second waterproof portion 33 has a groove 33a opening in a surface (the surface can form the cover side matching surface 29) opposed to the upper surface 31a of the second waterproof portion 31 of the main body side waterproof structure 20. The groove 35a is formed so that the bottom side of the groove 35a is opened and the upper side thereof is a dead end. Furthermore, the groove 35a has a space formed in a desired size. In the inside of the groove 33a, an inner surface 33b, an outer surface 33c parallel to the inner surface 33b, and an innermost surface 33d connecting the inner surface 33c and the outer surface 35c are included. The inner surface 33b is located immediately above the inner surface 17b of the peripheral wall 17 of the box main body 14. The groove 33a is formed so that the inner surface 35b is arranged in the bottom end of the cover peripheral wall 23.

For arrangement of the groove 33a and an outlet position of the micro passage 27, a position of an intersection of the opening of the groove 33a with the inner surface 33b is set as an outlet reference 35. Further, a position of an intersection of the inner surface 17b of the peripheral wall 17 with the upper surface 31a of the second waterproof portion 31 is set as an outlet reference 36. As a result, the outlet references 36 and 37 are arranged on the same plane. That is, the outlet references 35 and 36 are arranged so that water is hard to discharge from the outlet and the outlet of the micro passage 27 is minimized as much as possible (when the outlet reference 35 is positioned inside the outlet reference 36, the width of the outlet is increased. As a result, water is easy to discharge from the outlet of the micro passage 27).

The second waterproof portion 33 has a wall-shaped portion 33e which continues to the groove 33a and extends thereto. The wall-shaped portion 33e has an inner surface 35f opposed to the outer surface 32b of the third waterproof portion 32 of the main body side waterproof structure 20. The inner surface 33f is formed as a surface including a part of the cover side matching surface 29. The inner surface 33f has a small chamfered portion 33g which is arranged in a position continuing to the first waterproof portion 32 (The chamfered portion 33g is also formed as the surface including a part of the cover side matching surface 29).

The first waterproof portion 32 is arranged under the second waterproof portion 33. The first waterproof portion 32 has a lower surface 32a opposed to the upper surface 30a of the first waterproof portion 30 of the main body side waterproof structure 20 and an inner surface 32b opposed to the outer surface 30b which is formed in a tapered shape. Further, the first waterproof portion 32 is formed into a wall shape. One end of the lower surface 32a continues to the chamfered portion 33g of the second waterproof portion 33, and the other end thereof continues to the inner surface 32b. The inner surface 32b is a tapered surface, and formed so that the inner surface 32b is abut on the outer surface 30b and fit therein when the upper cover 15 is moved upside. The lower surface 32a and the inner surface 32b are formed as a surface including a part of the cover side matching surface 29.

The reference numeral 32c of the first waterproof portion 32 shows a chamfered portion continuing to the inner surface 32b. Also, the reference numeral 32d shows an inlet position lower surface opposed to the inlet position lower surface 30c of the first waterproof portion 30 of the main body side waterproof structure 20. The chamfered portion 32c and the inlet position lower surface 32d are formed as a surface including a part of the cover side matching surface 29. Further, the reference numeral 32e shows an inlet position outer surface perpendicular to the inlet position lower surface 32d and parallel to the inside surface 17b of the peripheral wall 17. The inlet position outer surface 32e is formed as a surface including a part of the outer surface 32f of the first waterproof portion 32.

The rotation supporting point 24 arranged in the cover side waterproof structure 26 has a through hole (not shown) which is able to insert the projection-shaped rotation supporting point 18 of the main body side waterproof structure 20 and a pair of protective walls 24a arranged in both sides of the through hole. The protective walls 24a are formed into a rib shape, and extend in up and down direction.

The wall 34, as presented above, is arranged at a predetermined interval in front of the inlet of the micro passage 27.

The wall 34 is continued to a projection tip (the outermost position) of the protective walls 24a, and is located parallel to the outer surface 32f of the first waterproof portion 32. The wall 34 (inner surface 34a) has a space 37 between the outer surface 32f of the first waterproof portion 32 and the inlet position outer surface 30d of the first waterproof portion 30. Further, the wall 34 is arranged at a predetermined interval against the outer surface 17a of the peripheral wall 17 and opposed to the outer surface 17a. In addition, washing water can pass through the wall 34 in up and down direction by the space 37. Also, the wall 34 may arrange a projection or rib on the outer surface 17a of the peripheral wall 17, and may be coupled with the tip of the projection or rib.

Reverting to FIG. 2, the inner wall 12a is arranged in a cavity of the functional parts 12. The inner wall 12a is arranged at a predetermined interval from an inner surface 17b of the peripheral wall 17 of the box main body 14. The inner wall 12a is formed to project so that the tip 12b of the inner wall 12a is located at a base end of the cover peripheral wall 23. The tip 12b of the inner wall 12a is positioned above the outlet position of the micro passage 27. The inner wall 12a is formed as a part so as to keep fluid such as water away from electric components (components do not like water) separately from the main body side waterproof structure 20 and the cover side waterproof structure 26.

To prevent the ingress of water against the electric components (pars do not like water), although the main body waterproof structure 20 and the cover waterproof structure 26 are sufficient, it appears the inner wall 12a effectively enhance its reliability.

As shown in FIG. 4, the upper cover 15 has an inner wall 38 opposed to the inner surface 17b of the peripheral wall 17 of the box main body 14 and extending thereto. The inner wall 38 extends from the lower end of the cover peripheral wall 23 and is arranged therein. The inner wall 38 is provided without a wall having the rotation supporting portion 24 which is the center of rotation of the upper cover 15. Because the upper cover 15 is rotatably moved, the inner wall 38 is arranged except the above wall in view of rotation trajectory. On the wall having the rotation supporting potion 24, a taper portion 39 is arranged so that the tip of the taper portion 39 is positioned under the outlet portion of the micro passage 27. The taper portion 39 slightly functions as an inner wall.

In the above configuration and structure, while having the upper cover 15 with one hand, the rotation supporting point 24 of the upper cover 15 is inserted into the rotation supporting point 18 of the box main body 14. And then, the upper cover 15 is rotated around the rotation supporting points 18 and 24, and the cover lock 25 of the upper cover 15 is hooked to the main body lock 19 of the main body 14 and locked therein (locked state). An upper opening of the box main body 14 is covered with the upper cover 15. At this time, when the main body side waterproof structure 20 and the cover side waterproof structure 26 are overlapped, the formation of the waterproof structure as shown in FIGS. 4 and 5 is completed. Also, when the main body side waterproof structure 20 and the cover side waterproof structure 26 are overlapped, the main body side matching surface 28 opposes to the cover side matching surface 29. Furthermore, since the inlet of the micro passage 27 is arranged at the outer side of an orthogonal direction against the outer surface 17a of the peripheral wall 17 of the box main body 14, the wall 34 is located in front of the inlet.

When high-pressure washing is performed, the washing water injected toward the waterproof box 11 hits in the outer surface 17a of the peripheral wall 17 of the box main body 14. Thereafter the washing water rises along the peripheral wall 17. The washing water rising along the peripheral wall 17 hits in the lower surface 30e of the first waterproof portion 30 of the main body side waterproof structure 20. As a result, force of the washing water is reduced. Furthermore, some of the washing water rising along the peripheral wall 17 (or falling along the cover peripheral wall 23) flows upward (or downward) by the space 37 arranged inside of the wall 34.

The inlet of the micro passage 27 is arranged away from the outer surface 17a of the peripheral wall 17 of the box main body 14, and the washing water flows upward by the space 37 arranged inside of the wall 34. As a result, it is difficult to directly hit the washing water in the inlet of the micro passage 27, and the ingress of water is difficult. Besides the above, since the ingress of water from a front of the inlet of the micro passage 27 is prevented by the wall 34, the ingress of water is difficult (if the wall is not arranged, water is entered because the washing water hits from the front of the inlet of the micro passage 27).

Additionally, by the force of the washing water, if the upper cover 15 is moved in the arrow S, namely the upper cover 15 is uplifted, or water is entered, at this time the tapered outer surface 30b of the first waterproof portions 30 and the tapered inner surface 32b of the first waterproof portion 32 are abutted and engaged to each other. As a result, the inlet of the micro passage 27 is closed. Thereby, the ingress (pass) of water is prevented.

Furthermore, even if water is entered before the tapered outer surface 30b and the tapered inner surface 32b are engaged, the ingress (pass) of water is prevented because the micro passage 27 has a plurality of steps (corners) and is formed in a maze shape.

Furthermore, even through water is entered between the outer surface 31b of the second waterproof portion 31 and the inner surface 33f of the third waterproof portion 33, water is entered in the groove 33a and force of the water is reduced because the direction of water movement is an extending direction of the outer surface 32b and the inner surface 35f. The groove 35a functions as a buffer, and the water in which the force of the water is reduced falls down.

Since the outlet of the micro passage 27 is formed such as to be narrowed as much as possible as mentioned above, this makes exiting of water of which momentum is reduced after infiltrating into the groove 33a unlikely. Even if water exits from the outlet of the small passage 27, the water falls such as to stream down the inner face 17b of the side wall 17 to be discharged from a not-shown drain outlet of the lower cover 16.

In conclusion, as is understood from the above explanation with reference to drawings, the waterproof box of the present invention can improve waterproof performance than ever before. Further, work efficiency can be increased and space can be saved, because the upper covers 15 and 51 can be attached and removed with one hand.

It is to be understood that such changes and modifications will be apparent to be implemented within the spirit of the invention.

| Reference sings | |
| --- | --- |
| 1 | electric junction box |
| 2 | vehicle |
| 3 | engine room |
| 4 | engine |
| 5 | battery |
| 11 | waterproof box |
| 12, 13 | functional parts |
| 14 | box main body |

-continued

| Reference sings | |
|---|---|
| 15 | upper cover (cover) |
| 16 | lower cover |
| 17 | peripheral wall |
| 18 | rotation supporting point |
| 19 | main body lock |
| 20 | main body side waterproof structure |
| 21 | joint |
| 22 | ceiling wall |
| 23 | cover peripheral wall |
| 24 | rotation supporting point |
| 25 | cover lock |
| 26 | cover side waterproof structure |
| 27 | micro passage |
| 28 | main body side matching surface |
| 29 | cover side matching surface |
| 30, 32 | first waterproof portion |
| 31, 33 | second waterproof portion |
| 35, 36 | outlet reference |
| 37 | space |
| 38 | inner wall |
| 39 | taper portion |

What is claimed is:

1. A waterproof box comprising:
a box main body having a peripheral wall and receiving components inside of the peripheral wall, the components disliking water;
a cover having a cover peripheral wall and covering an opening of edges of the peripheral wall of the box main body;
a main body side waterproof structure arranged in the edges of the peripheral wall of the box main body; and
a cover side waterproof structure arranged in edges of cover peripheral wall of the cover,
wherein the main body side waterproof structure is overlapped with the cover side waterproof structure so as to waterproof, and
wherein a wall, which is located outside an overlapped portion and opposed to an outer surface of the peripheral wall at a predetermined space, is provided as a part of the cover side waterproof structure with respect to a horizontal direction and separated from the main body side waterproof structure,
wherein rotation supporting points are arranged in the main body side waterproof structure and the cover side waterproof structure respectively so as to rotatably and removably move the cover against the box main body,
wherein the rotation supporting point of the cover side waterproof structure comprises a through hole and a pair of protective walls which are formed on both sides of the through hole and formed into a rib shape,
wherein the main body side waterproof structure comprises a first waterproof portion arranged as an inlet of a micro passage and a second waterproof portion arranged as an outlet of the micro passage,
wherein the wall is formed at an outermost position of the protective walls, and a lower wall of the first waterproof portion is projected toward the wall, and
wherein a space is formed between the wall and an outer surface of the first waterproof portion.

2. The waterproof box as claimed in claim 1, further comprising
a main body side matching surface of the main body side waterproof structure, a cover side matching surface of the cover side waterproof structure, and a micro passage generated in a space between the main body side matching surface and the cover side matching surface,
wherein the main body side matching surface and the cover side matching surface are opposed each other by overlapping, and
wherein an inlet of the micro passage is arranged so that the wall of the cover side waterproof structure is positioned in front of the inlet at an interval.

3. The waterproof box as claimed in claim 2, wherein the inlet of the micro passage is arranged outward in a direction perpendicular to the outer surface of the peripheral wall of the box main body.

4. The waterproof box as claimed in claim 1, wherein
an outer surface of the first waterproof portion is formed into a taper shape in which a distance from an inner surface of the peripheral wall becomes gradually small toward bottom.

5. The waterproof box as claimed in claim 4, wherein
the cover side waterproof structure comprises a first waterproof portion arranged as an inlet of the micro passage, a second waterproof portion arranged as an outlet of the micro passage, and is formed which wall is in a skirt shape opening outward.

6. The waterproof box as claimed in claim 5, wherein
the second waterproof portion of the cover side waterproof structure comprises a groove opening in a surface opposed to an upper surface of the second waterproof portion of the main body side waterproof structure; and comprising a space formed by an upper surface of the second waterproof portion of the main body side waterproof structure, an inner surface, an outer surface, and an innermost surface of the second waterproof portion of the cover side waterproof structure.

7. The waterproof box as claimed in claim 6, wherein
a first outlet reference which is a position of an intersection of an opening of the groove with the inner surface of the second waterproof portion of the cover side waterproof structure; and a second outlet reference which is a position of an intersection of an inner surface of the peripheral wall with the upper surface of the second waterproof portion of the main body side waterproof structure; are arranged on a same plane.

* * * * *